United States Patent
Guinn

(10) Patent No.: US 9,917,413 B2
(45) Date of Patent: Mar. 13, 2018

(54) COOLING APPARATUS FOR DIODE-LASER BARS

(71) Applicant: Coherent, Inc., Santa Clara, CA (US)

(72) Inventor: Keith V. Guinn, Thousand Oaks, CA (US)

(73) Assignee: COHERENT, INC., Santa Clara, CA (US)

( * ) Notice: Subject to any disclaimer, the term of this patent is extended or adjusted under 35 U.S.C. 154(b) by 0 days.

(21) Appl. No.: 15/377,491

(22) Filed: Dec. 13, 2016

(65) Prior Publication Data

US 2017/0237231 A1     Aug. 17, 2017

Related U.S. Application Data

(60) Provisional application No. 62/293,945, filed on Feb. 11, 2016.

(51) Int. Cl.
    *H01S 5/024*      (2006.01)
    *H01L 23/473*      (2006.01)
    *H01S 5/40*      (2006.01)

(52) U.S. Cl.
    CPC ........ *H01S 5/02423* (2013.01); *H01L 23/473* (2013.01); *H01S 5/4025* (2013.01)

(58) Field of Classification Search
CPC ... H01S 5/02423; H01S 5/4025; H01L 23/473
See application file for complete search history.

(56) References Cited

U.S. PATENT DOCUMENTS

| | | | |
|---|---|---|---|
| 5,305,344 A | 4/1994 | Patel | |
| 5,311,530 A | 5/1994 | Wagner et al. | |
| 5,727,618 A * | 3/1998 | Mundinger | F28F 3/086 165/185 |
| 6,240,116 B1 | 5/2001 | Lang et al. | |
| 6,480,514 B1 | 11/2002 | Lorenzen et al. | |
| 7,139,172 B2 | 11/2006 | Bezama et al. | |
| 8,591,078 B2 | 11/2013 | Igl et al. | |
| 8,804,781 B2 | 8/2014 | Schleuning et al. | |
| 2006/0108098 A1* | 5/2006 | Stevanovic | H01L 23/473 165/80.4 |

FOREIGN PATENT DOCUMENTS

EP      1696526 A1     8/2006

OTHER PUBLICATIONS

International Search Report and Written Opinion received for PCT Patent Application No. PCT/US2017/014063, dated Mar. 9, 2017, 12 pages.

* cited by examiner

*Primary Examiner* — Xinning Niu
(74) *Attorney, Agent, or Firm* — Morrison & Foerster LLP

(57) ABSTRACT

A cooler for diode-laser bars comprises a machined base including a water-input plenum and a water-output plenum, and a top plate on which the diode-laser bars can be mounted. A stack of three etched plates is provided between the base and first plate. The stack of etched plates is configured to provide a five longitudinally spaced-apart rows of eight laterally spaced-apart cooling-channels connected to the water-input and water-output plenums. Water flows in the cooling-channels and in thermal contact with the first plate.

6 Claims, 4 Drawing Sheets

COOLING APPARATUS FOR DIODE-LASER BARS

PRIORITY CLAIM

This application claims priority of U.S. Provisional Application No. 62/293,945, filed Feb. 11, 2016, the complete disclosure of which is hereby incorporated herein by reference.

TECHNICAL FIELD OF THE INVENTION

The present invention relates in general to packaging diode-laser bars. The invention relates in particular to packaging diode-laser bars on a water-cooled heat sink.

DISCUSSION OF BACKGROUND ART

The term "packaging", applied to diode-laser bars, refers to mounting a diode-laser bar, or an array of diode-laser bars, on some sort of cooling-base or heat-sink. This base may be a relatively massive base providing a "conductively cooled package" (CCP). For higher power operation, the base is typically water-cooled, for example by a micro-channel arrangement.

A diode-laser bar includes a plurality of semiconductor layers epitaxially grown on a single-crystal substrate, with a plurality of diode-laser emitters defined in the epitaxial layers. Typically, the substrate is an n-type substrate, and layers are grown such that layers forming the "p-side" (anode-side) of the diodes are uppermost. The diode-laser bar is soldered "p-side down" either directly onto the heat-sink or via a sub-mount having a coefficient of thermal expansion (CTE) intermediate that of the substrate material and the heat-sink material, which is usually copper.

In micro-channel cooled arrangements, cooling-channels generally have internal dimensions of about 0.5 millimeters (mm) or less with water forced through the channels by high pressure at relatively high velocities. This also can lead to rapid corrosion of the copper in which the water-cooling channels are formed. This corrosion can be somewhat mitigated by plating the water-cooling channels with a metal such as gold. However, since the micro-channels are "internal" to the heat-sink, the plating can only be achieved by immersion-plating, usually using forced-flow plating-solutions. This results in uneven plating, with the internal nature of the channels preventing non-destructive inspection for quality assurance. There is a need for an improved water-cooled heat-sink for diode-laser bars that will facilitate plating of cooling-channels.

SUMMARY OF THE INVENTION

In one aspect, cooling apparatus in accordance with the present invention for diode-laser bars, comprises a base-member including a water-input plenum and a water-output plenum. A first plate is provided on which the diode-laser bars can be mounted. A plurality of N other plates is stacked between the base and first plate. The N other plates are configured to provide a plurality M of longitudinally spaced-apart rows of laterally spaced-apart cooling-channels in fluid communication with the water-input and water-output plenums, and in thermal contact with the first plate.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
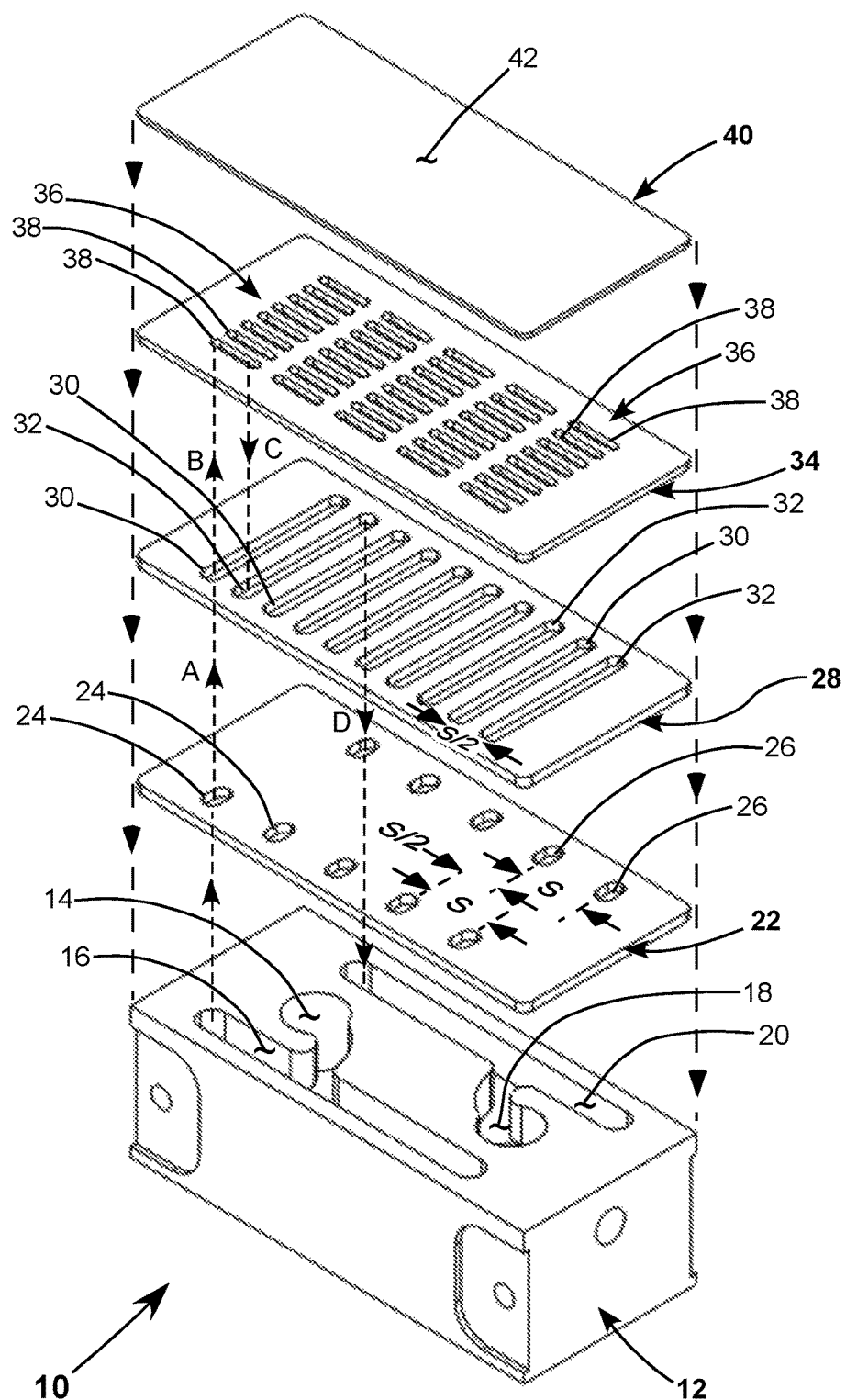
FIG. 1 is an exploded three-dimensional view schematically illustrating one preferred embodiment of a macro-channel cooler in accordance with the present invention, comprising a machined base including a water input plenum and a water output plenum, a top plate on which diode-laser bars can be mounted, and a stack of three etched plates configured to provide five rows of eight cooling-channels in fluid communication with the input and output plenums and in thermal contact with the top plate.
Figure 1A:
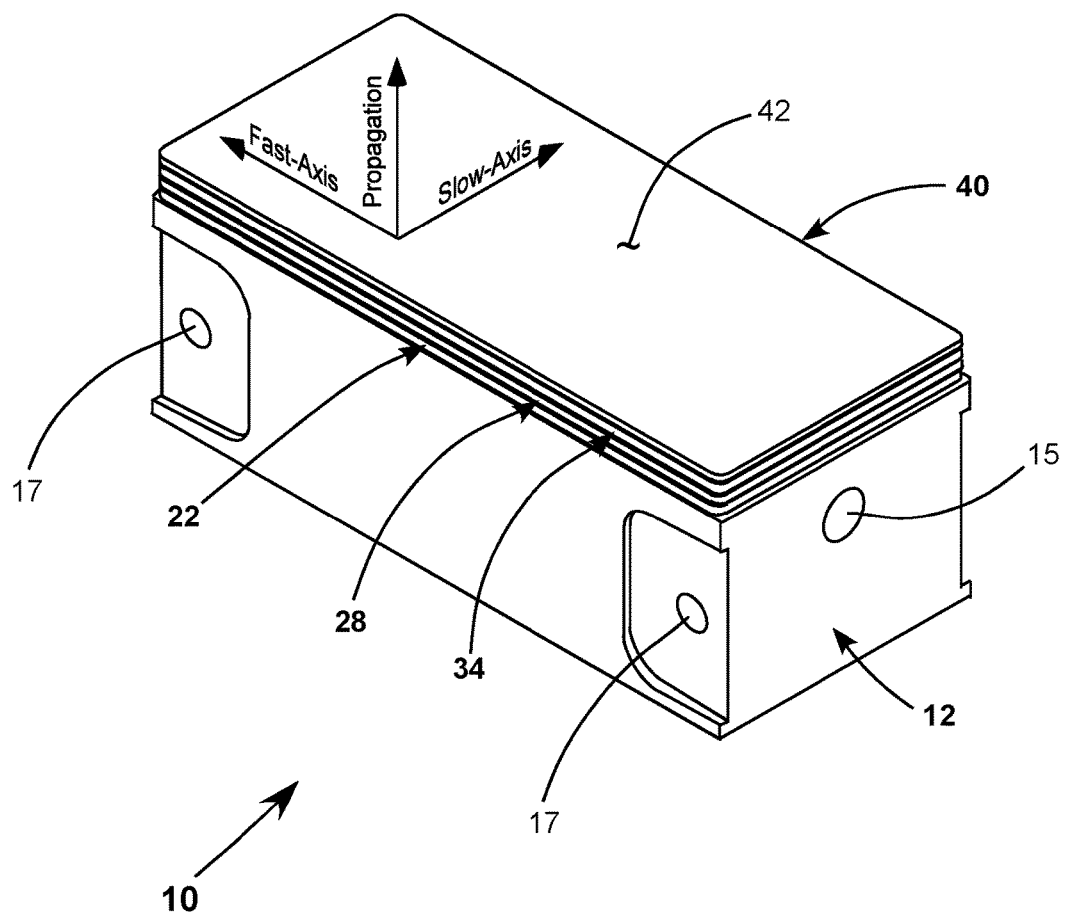
FIG. 1A shows the cooler of FIG. 1 in assembled form.

Turning now to the drawings, wherein like features are designated by like reference numerals, FIG. 1 schematically illustrates one preferred embodiment 10 of a water-cooled macro-channel cooler in accordance with the present invention. Cooler 10 is depicted in "exploded" form to illustrate the inventive manner in which water flows through the cooler. Cooler 10 is depicted in assembled form in FIG. 1A, with water-flow arrangements not visible.

Cooler 10 includes an elongated rectangular base member 12 including a water-inlet conduit 14 in fluid communication with an elongated inlet-plenum 16, and a water-outlet conduit 18 in fluid communication with an elongated outlet-plenum 20. Standard water connections (not shown) for connecting the inlet and outlet conduits to supply and exhaust (drain) tubing are provided below the base, in the orientation of the drawing. The conduits and plenums are machined into the base using conventional metal-machining methods.

An aperture-plate 22 has a longitudinally-extending plurality (here, five) of inlet-apertures 24, equally-spaced apart, by a distance S, adjacent one edge of the plate, and a corresponding longitudinally-extending plurality of outlet-apertures 26, equally-spaced apart adjacent by the same distance S adjacent an opposite edge of the plate. The location of the inlet and outlet apertures are staggered such that the longitudinal spacing of any outlet-aperture from a corresponding inlet-aperture is S/2, as indicated in the drawing. Inlet-apertures 24 and outlet-apertures 26 are aligned over, and in fluid communication with, inlet-plenum 16 and outlet-plenum 20 in base 12, respectively.

A connecting-channel-plate 28 includes a plurality (here, five) of longitudinally spaced-apart, laterally extending inlet-channels 30, and a corresponding plurality of longitudinally spaced-apart, laterally extending outlet-channels 32. Each inlet-channel 30 is spaced apart from an adjacent outlet-channel 32 by a distance S/2. Each inlet-channel 30 is aligned in fluid communication with a corresponding inlet-aperture 24 in aperture-plate 22. Each outlet-channel 32 is aligned in fluid communication with a corresponding outlet-aperture 26 in aperture-plate 22.

Bonded on connecting-channel-plate 28 is a cooling-channel-plate 34. Plate 34 includes a plurality (here again, five) of laterally-extending longitudinally spaced-apart rows 36 of longitudinally extending, laterally spaced apart cooling-channels 38. The rows of cooling-channels are configured and arranged in plate 34 such that each cooling-channel is in fluid communication with an inlet-channel 30 and an adjacent outlet-channel 32 in plate 28.

A mounting-plate 40 for diode-laser bars is bonded to plate 34 in thermal contact with cooling-channels 38. The thermal contact as used in this description and the appended claims means that plate 40 is in thermal contact with water flowing in cooling-channels 38. An exposed upper surface 42 of plate 40 serves as a mounting surface for diode-laser bars (not shown). A description of water-flow through the inventive cooler is set forth below, with continuing reference to FIG. 1.

Water from an external supply (not shown) enters cooler 10 though inlet-conduit 14 in base 12 of the cooler. Water flows from the inlet-conduit, under pressure of the external supply, filling inlet-plenum 16. Water flows, again under pressure of the external supply, through an inlet-aperture 24 in plate 22, as indicted in FIG. 1 by arrow A, and into a corresponding inlet-channel 30 in plate 28. The external water pressure causes water to fill the inlet-channel 30.

Water from inlet-channel 30 flows into each of the corresponding cooling-channels 38 in plate 34, filling the cooling-channels. Flow is indicated, by arrow B, for only one-channel 38, for simplicity of illustration. Water flows through cooling-channels 38 into corresponding outlet-channel 32 in plate 28 as indicated by arrow C. Water flows out of the outlet-channel, through an outlet-aperture 26 in plate 22 (indicated by arrow D), into outlet-plenum 20 in base 12, and flows out of base-12 via outlet-conduit 18 thereof.

Regarding suitable materials for components of cooler 10, base 12 and plates 22, 28, and 34, are preferably made from a highly thermally-conductive metal, most preferably copper. Plate 40 is also preferably made from copper, but is sufficiently thin that a copper-ceramic laminate or copper-metal laminate such as a copper-molybdenum-copper (CuMoCu) laminate having a lower thermal conductivity than that of copper, may be used for providing a coefficient of thermal expansion (CTE) match with objects mounted on surface 42. Such laminate materials are available from a number of commercial suppliers.

While base 12 is preferably made by metal machining methods, all other plates are preferably formed by photo-chemical etching, which is particularly effective in minimizing costs of forming the inventive cooler. Each plate can be conveniently gold-plated after being formed, but before being bonded, which provides for a gold-plated water-cooling path for minimizing corrosion as discussed above.

Bonding plate 22 to base 12, and bonding plates 22, 28, 34, and 40 together, is preferably accomplished by reflow-soldering. Reflow-soldering is well known in the art to which the present invention pertains and a detailed description thereof is not necessary for understanding principles of the present invention. Accordingly, such a detailed description is not presented herein.

Referring again to FIG. 1A, it is intended, albeit not necessary, that diode-laser bars be mounted (typically on electrically insulating sub-mounts) on surface 42 with characteristic fast-, slow- and propagation-axes of the diode-laser bars oriented, as indicated in the drawing, i.e., with the fast-axis aligned with the longitudinal direction of the cooler. The diode-laser bars are not explicitly shown, for simplicity of illustration.

A number of such diode-laser bars could be mounted spaced apart in the fast axis direction, with axes thereof oriented as indicated in the drawing, to form a fast-axis stack of diode-laser bars. Threaded holes 15 and 17 are provided for attaching electrical terminals (not shown) to the inventive cooler, which terminals can be connected to the diode-laser bars. Mounting a plurality of diode-laser bars on a common heat-sink to form a fast-axis stack thereof is well known in the art to which the present invention pertains, and a detailed description thereof is not necessary for understanding principles of the present invention. Accordingly, such a detailed description is not presented herein.

Regarding exemplary dimensions of macro-channel cooler 10 and components thereof, the cooler preferably has a length of about 25 millimeters (mm) and a width of about 10 millimeters (mm). Plates 22, 28, 34, and 40, preferably have about the same length and width.

Plate 40 is the thinnest of the plates, with a thickness selected to minimize the thermal path to cooling-channels 38 in plate 34 consistent with plate 40 having sufficient rigidity to be compatible with the formation and assembly process. A suitable thickness for a copper plate 40 is between about 0.25 mm and about 0.5 mm. Plates 22, 28 and 34 preferably have a thickness between about 0.5 mm and about 1 mm.

The length and width of the channels is selected, consistent with the number of groups thereof, to optimize the "thermal-footprint" on mounting-plate 40 of the channels, and also to be compatible with the preferred reflow soldering process. The use of short channels 38 in groups 36 thereof allows the use of lower water-flow rate and lower water pressure than would a parallel array of single channels extending along the length of plate 40, or a serpentine array of channels. The resultant lower fluid velocity is advantageous in minimizing corrosion of the channels.

A preferred length of channels 38 is between about 2 mm and about 4 mm. A preferred width of channels 38 is between about 0.5 mm and about 1 mm. A preferred depth of the channels (corresponding to the thickness of plate 34) is between about 0.25 mm and about 0.5 mm.

A preferred length of channels 30 and 32 in plate 28 is between about 6 mm and about 8 mm. A preferred width of channels 30 and 32 is between about 1 mm and about 2 mm. A preferred depth of the channels (corresponding to the thickness of plate 28) is between about 0.5 mm and about 1 mm.

Plenums 16 and 20 in base 12, preferably have a length of about 12 mm, and a width between about 1.5 mm and about 2 mm. The plenums preferably have a depth between about 2 mm and about 3 mm.

Apertures 24 and 26 in plate 22 preferably have a width corresponding to the width of channels 30 and 32 in plate 28. The apertures preferably have a length between about 1.5 mm and about 2 mm corresponding to the width of plenums 16 and 20. A preferred depth of the channels (corresponding to the thickness of plate 22) is between about 0.5 mm and about 2 mm.

The above discussed range of dimensions for channels apertures and plenums in macro-cooler 10, is consistent with providing a water-flow rate through the cooler of between about 0.5 liters/min and 2 liters/min, with an inlet pressure of between about 50 kilopascal (kPa) and 150 kPa.

It should be noted, here, that the number of rows 36 of cooling-channels 38 in plate 38 is selected primarily for reasons stated above and is not intended to correspond to the number diode-laser bars to be mounted on plate 32, although that is not precluded. By way of example, the exemplified dimensions discussed above presume that a fast-axis stack of twelve diode-laser bars, each thereof having a power output of about 150 Watts (W), will be mounted, with slow-axes thereof parallel to each other and oriented as exemplified in FIG. 1A. The length of the diode-laser bars (width of the stack) is intended to extend to the edges of plate 40.

Figure 2:
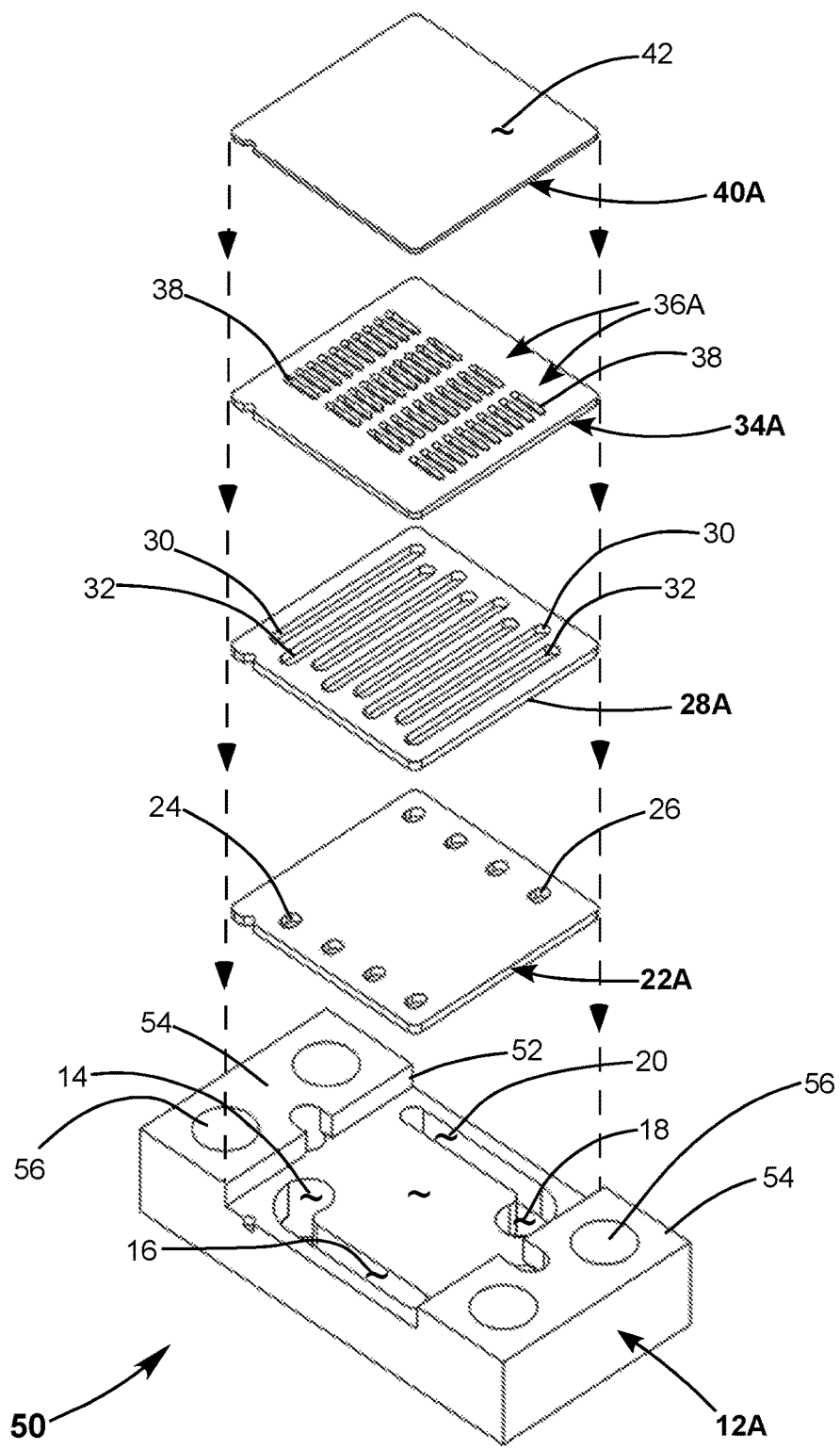
FIG. 2 is an exploded three-dimensional view schematically illustrating another preferred embodiment of macro-channel cooler in accordance with the present invention, similar to the macro-channel cooler of FIG. 1, but wherein the base is differently configured, and the top plate and the three etched plates are shorter and wider, providing four rows of ten cooling-channels in thermal contact with the top plate.
Figure 2A:
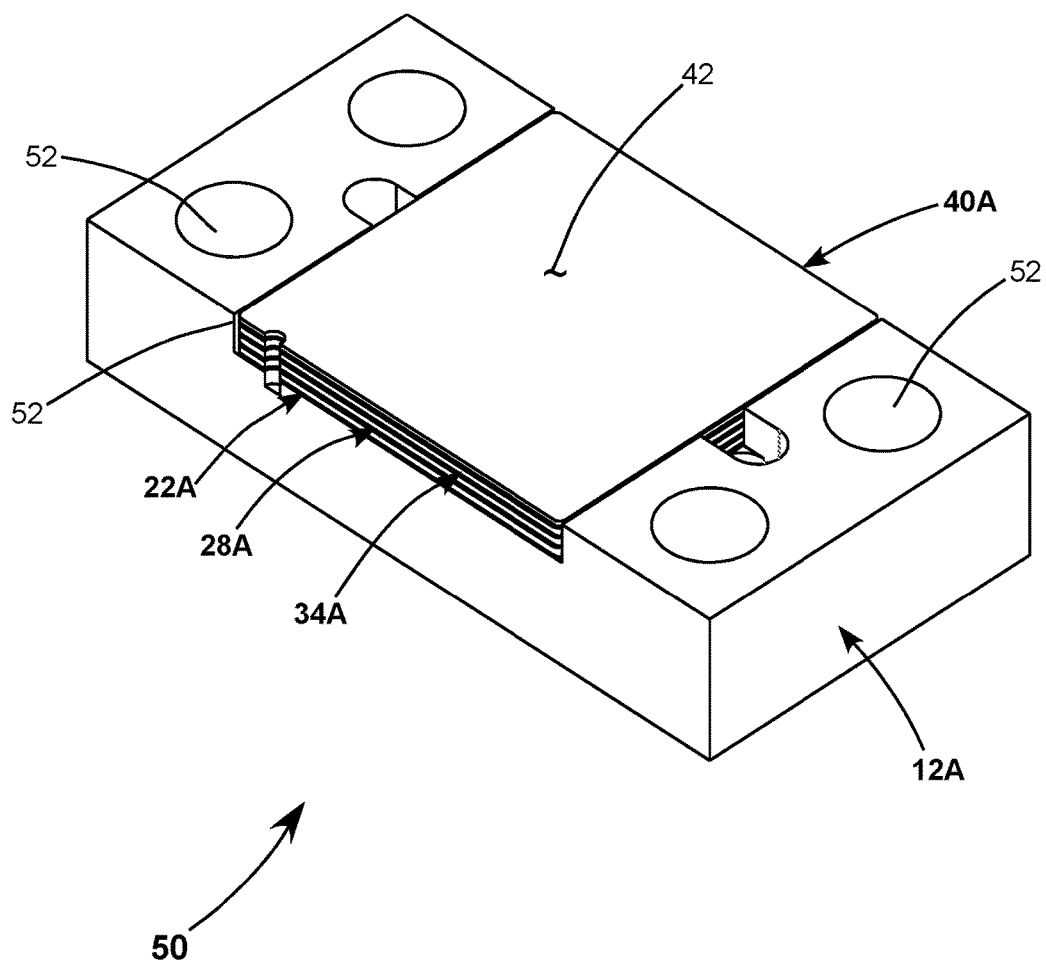
FIG. 2A shows the cooler of FIG. 2 in assembled form.

FIG. 2 schematically illustrates, in "exploded form", another preferred embodiment 50 of a water-cooled macro-channel cooler in accordance with the present invention. Cooler 50 is depicted in assembled form in FIG. 2A. Cooler 50 is similar to cooler 10 of FIGS. 1 and 1A, with exceptions as follows.

Plates 22, 28, 34, and 40 of cooler 10 are replaced in cooler 50 by plates 22A 28A, 34A, and 40A, which are shorter and wider than the corresponding plates in cooler 10. This enables four groups 36A of ten cooling-channels 38 in plate 34A, rather than the five groups of eight cooling-channels. As noted above cooler 10 of FIGS. 1 and 1A is designed to cool a stack of twelve diode-laser bars. Cooler 50 is designed to cool a fast-axis stack of eight diode-laser bars, with plate 40A having a width greater than the length of the diode-laser bars in the stack thereof. The extra width of plate 40A provides that the "thermal footprint" of cooling-channels 38 can extend up to or beyond the ends of the diode-laser bars.

There are correspondingly fewer inlet-channels 30 and outlet-channels 32 in plate 28A, and correspondingly fewer inlet-apertures 24 and outlet-apertures 26 than in corresponding plates of cooler 10. Except for the shorter length and greater width of the plates, all dimensions of apertures and channels therein is preferably as discussed above for cooler 10.

Base 12 of cooler 10 is replaced in cooler 50 by a base 12A having a recess 52 therein, which accommodates plates 22A, 28A, 34A, and 40A when the cooler is assembled. Plenums 16A and 20A in base 12A are shorter than corresponding plenums 16 but are similar in width. Portions 54 on opposite sides of base 12A include threaded holes for attaching electrical terminals to cooler 50 as discussed above with reference to base 12 of cooler 10.

The present invention is described above with reference to two preferred embodiments thereof. The present invention is not limited however to these embodiments. From the description provided above, those skilled in the art to which the present invention pertains may devise other embodiments of the invention without departing from the spirit and scope of the invention as defined by the claims appended hereto.

What is claimed is:

1. Cooling apparatus for diode-laser bars, comprising:
a base member including an elongated liquid input plenum and an elongated liquid output plenum, said output plenum being spaced apart and parallel to the input plenum;
a top plate on which the diode-laser bars can be mounted;
a first plate mounted above and adjacent to the base member and having a first set of apertures aligned with the input plenum and a second set of apertures aligned with output plenum, with the apertures in the second set being laterally offset from the apertures in the first set;
a second plate mounted above and adjacent to the first plate and including an array of elongated first channels, with alternate first channels being aligned with one of either an aperture in the first set of apertures in the first plate or an aperture in the second set of apertures the first plate; and
a third plate mounted above and adjacent to the second plate, having a plurality of arrays of second channels each extending in a direction perpendicular to the first channels in the second plate, each second channel extending between adjacent first channels in the second plate, wherein water entering the input plenum travels through one of the apertures in the first set of apertures in the first plate, into a first channel in the second plate, and then into an array of second channels in the third plate, and then back through a different first channel in the second plate and through one of the apertures in the second set of apertures in the first plate and into the output plenum.

2. The apparatus of claim 1 wherein the number of arrays of second channels in the third plate is one half the number of first channels in the second plate.

3. The apparatus as recited in claim 2 wherein number of apertures in the first set of apertures is one half the number of first channels in the second plate.

4. The apparatus as recited in claim 3 wherein number of apertures in the second set of apertures is one half the number of first channels in the second plate.

5. The apparatus as recited in claim 1 wherein the axes of the elongated input and output plenums are perpendicular to the axes of the first channels in the second plate.

6. The apparatus as recited in claim 5 wherein the first and second set of apertures in the first plate have a circular configuration.

* * * * *